United States Patent
Ono et al.

(10) Patent No.: US 9,865,468 B2
(45) Date of Patent: Jan. 9, 2018

(54) METHOD OF POSITIONING CUTTING MEMBER TO SEMICONDUCTOR CHIP WITH GROOVES

(71) Applicant: FUJI XEROX CO., LTD., Tokyo (JP)

(72) Inventors: Kenichi Ono, Ebina (JP); Michiaki Murata, Ebina (JP); Tsutomu Otsuka, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/875,769

(22) Filed: Oct. 6, 2015

(65) Prior Publication Data

US 2016/0172203 A1 Jun. 16, 2016

(30) Foreign Application Priority Data

Dec. 15, 2014 (JP) ................. 2014-253227

(51) Int. Cl.
*H01L 21/00* (2006.01)
*H01L 29/06* (2006.01)
(Continued)

(52) U.S. Cl.
CPC ........ *H01L 21/3043* (2013.01); *H01L 21/268* (2013.01); *H01L 21/3065* (2013.01);
(Continued)

(58) Field of Classification Search
CPC ............... H01L 21/6836; H01L 21/304; H01L 21/6835; H01L 21/3043; H01L 21/268; H01L 21/3065; H01L 21/78; H01L 23/544

See application file for complete search history.

(56) References Cited

U.S. PATENT DOCUMENTS 7,824,962 B2 * 11/2010 Mariani .................. H01L 21/78
438/110
9,385,268 B2 * 7/2016 Minamiru ............... H01L 21/78
(Continued)

FOREIGN PATENT DOCUMENTS

JP 2003-124151 A 4/2003
JP 2009-088252 A 4/2009
(Continued)

OTHER PUBLICATIONS

Communication dated Apr. 25, 2016 issued by European Patent Office in counterpart European Patent Application No. 15193328.0.
(Continued)

*Primary Examiner* — Alonzo Chambliss
(74) *Attorney, Agent, or Firm* — Sughrue Mion, PLLC

(57) ABSTRACT

Provided is a method for manufacturing a semiconductor chip including forming a groove on a front surface side along a cut area of a substrate, and a concave portion deeper than the groove on the front surface side as a positioning mark for a cutting member that performs cutting from a back surface of the substrate along the groove on the front surface side, thinning the substrate so as to reach the concave portion and not reach the groove on the front surface side, in the back surface of the substrate, positioning the cutting member from the back surface of the substrate by using the concave portion exposed on the back surface of the substrate as the positioning mark, and performing cutting from the back surface side of the substrate toward the groove on the front surface side of the substrate by using the positioned cutting member.

19 Claims, 9 Drawing Sheets

(51) Int. Cl.
  *H01L 21/304* (2006.01)
  *H01L 21/268* (2006.01)
  *H01L 21/3065* (2006.01)
  *H01L 21/78* (2006.01)
  *H01L 23/544* (2006.01)
  *H01L 21/683* (2006.01)

(52) U.S. Cl.
  CPC .......... *H01L 21/6836* (2013.01); *H01L 21/78* (2013.01); *H01L 23/544* (2013.01); *H01L 2221/6834* (2013.01); *H01L 2221/68327* (2013.01); *H01L 2221/68381* (2013.01); *H01L 2223/5442* (2013.01); *H01L 2223/54426* (2013.01); *H01L 2223/54453* (2013.01); *H01L 2924/0002* (2013.01)

(56) References Cited

U.S. PATENT DOCUMENTS

| | | |
|---|---|---|
| 2001/0055856 A1 | 12/2001 | Tao |
| 2003/0186513 A1* | 10/2003 | Turner .............. H01L 21/76898 438/462 |
| 2005/0081958 A1* | 4/2005 | Adachi ............. H01L 21/76251 148/33.1 |
| 2006/0082256 A1 | 4/2006 | Bibl et al. |
| 2011/0127645 A1 | 6/2011 | Kang et al. |
| 2011/0175225 A1 | 7/2011 | Seddon et al. |
| 2014/0042595 A1* | 2/2014 | Schulze .................. H01L 21/78 257/622 |
| 2014/0235035 A1* | 8/2014 | Stranzl .................... H01L 21/78 438/462 |

FOREIGN PATENT DOCUMENTS

| | | |
|---|---|---|
| JP | 2012-64961 A | 3/2012 |
| JP | 2013-247175 A | 12/2013 |

OTHER PUBLICATIONS

Taiwanese Office Action issued in Taiwanese Application No. 104136680 dated Mar. 31, 2017.

\* cited by examiner

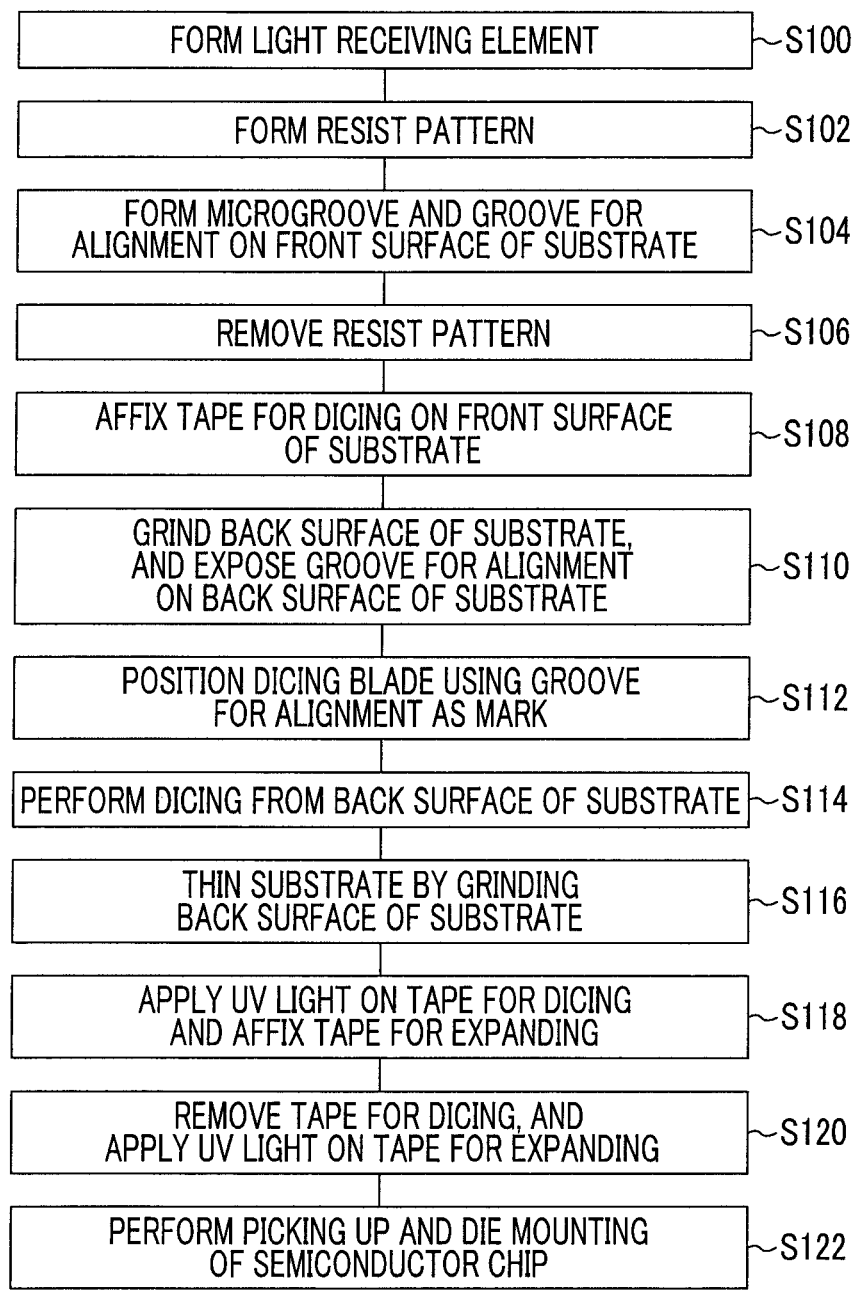

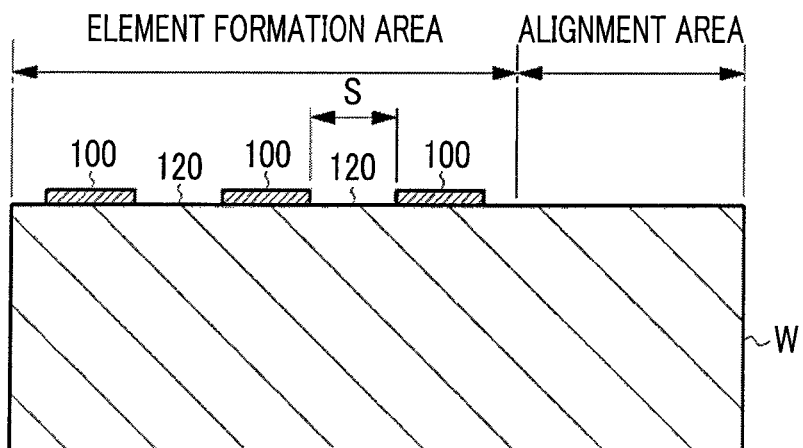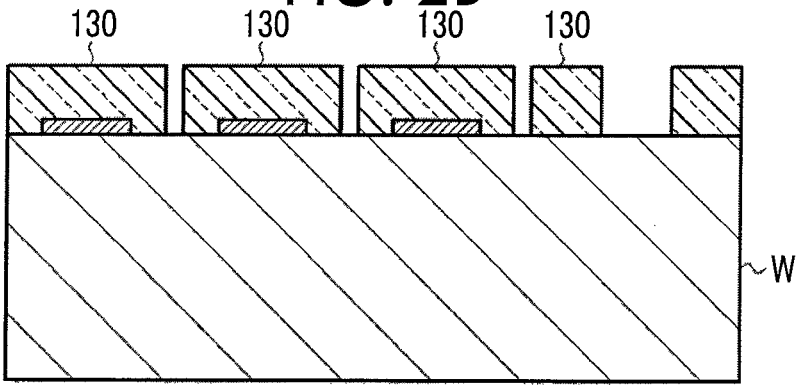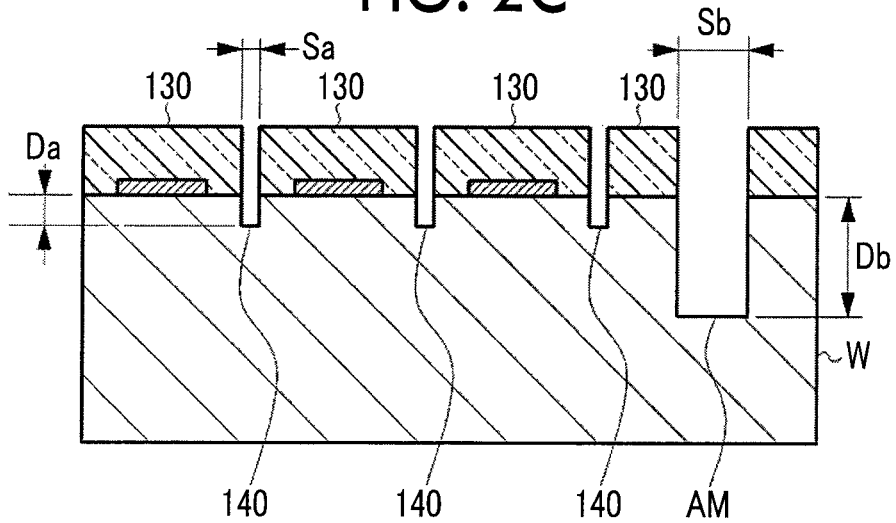

FIG. 3A
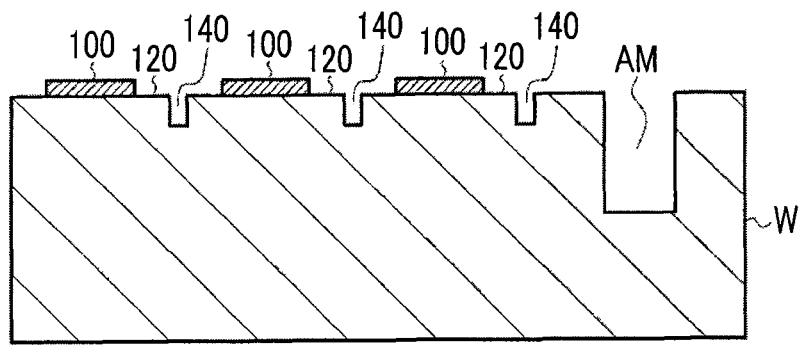
FIG. 3B
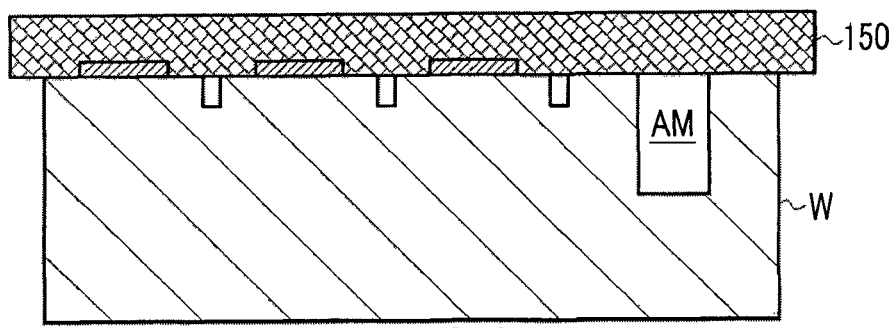
FIG. 3C
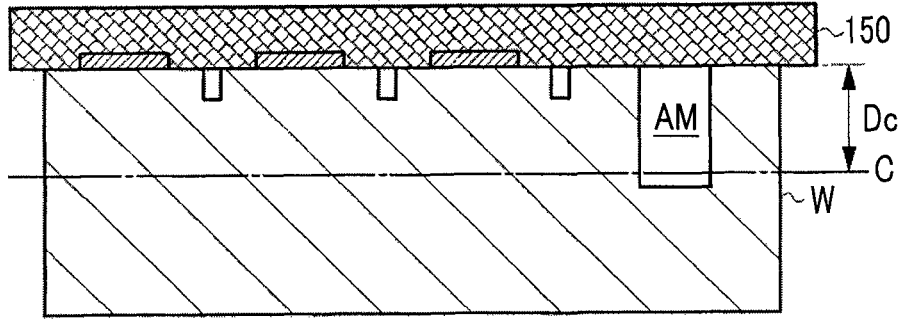
FIG. 3D
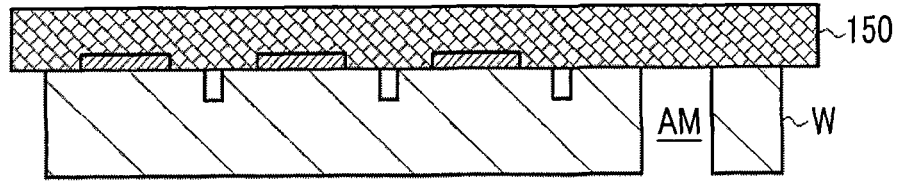

METHOD OF POSITIONING CUTTING MEMBER TO SEMICONDUCTOR CHIP WITH GROOVES

CROSS-REFERENCE TO RELATED APPLICATIONS

This application is based on and claims priority under 35 USC 119 from Japanese Patent Application No. 2014-253227 filed Dec. 15, 2014.

BACKGROUND

Technical Field

The present invention relates to a method for manufacturing a semiconductor chip and a method for positioning a cutting member.

SUMMARY

According to an aspect of the invention, there is provided a method for manufacturing a semiconductor chip including:

forming a groove on a front surface side along a cut area of a substrate, and a concave portion deeper than the groove on the front surface side as a positioning mark for a cutting member that performs cutting from a back surface of the substrate along the groove on the front surface side;

thinning the substrate so as to reach the concave portion and not reach the groove on the front surface side, in the back surface of the substrate;

positioning the cutting member from the back surface of the substrate by using the concave portion exposed on the back surface of the substrate as the positioning mark; and performing cutting from the back surface side of the substrate toward the groove on the front surface side of the substrate by using the positioned cutting member.

BRIEF DESCRIPTION OF THE DRAWINGS

Exemplary embodiments of the present invention will be described in detail based on the following figures, wherein:

FIG. 1 is a flowchart illustrating an example of a manufacturing process of a semiconductor chip according to an exemplary embodiment of the present invention;

FIGS. 2A to 2C are schematic sectional views of a semiconductor substrate in the manufacturing process of the semiconductor chip according to the exemplary embodiment of the present invention;

FIGS. 3A to 3D are schematic sectional views of a semiconductor substrate in the manufacturing process of the semiconductor chip according to the exemplary embodiment of the present invention;

FIG. 6A is an example illustrating a depth of a back surface groove which is formed in such a manner that the back surface groove formed by the dicing blade reaches a microgroove, and FIG. 6B is an example in which a back surface groove is formed to the front of a microgroove by the dicing blade;

DETAILED DESCRIPTION

Figure 4A:
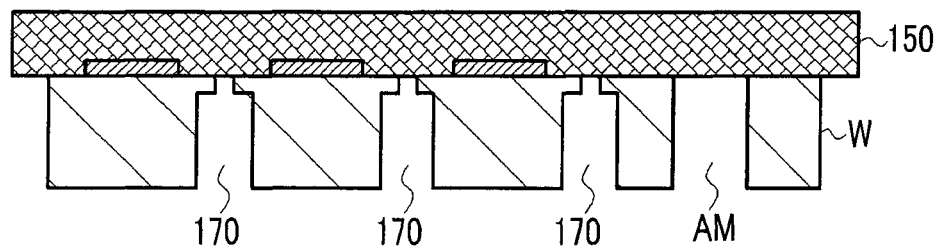
FIGS. 4A to 4E are schematic sectional views of a semiconductor substrate in the manufacturing process of the semiconductor chip according to the exemplary embodiment of the present invention.

For example, a method for manufacturing a semiconductor chip according to the present invention is applied to a method of dividing (dicing) members with a substrate shape such as a semiconductor wafer in which plural semiconductor elements are formed, and for manufacturing each semiconductor chip. The semiconductor elements formed on the substrate are not limited to a particular element, and may include a light emitting element, a light receiving element, an active element, a passive element, or the like. The manufacturing method according to the present invention may be applied to a method of extracting a semiconductor chip including, for example, a light emitting element from a substrate, and the light emitting element may be, for example, a surface-emitting type semiconductor laser, a light emitting diode, or a light emitting thyristor. In addition, the manufacturing method according to the present invention may be applied to a method of extracting a semiconductor chip including, for example, a light receiving element from a substrate, and the light receiving element may be, for example, a contact image sensor, or a line sensor. One semiconductor chip may include a single light emitting element, and may include plural light emitting elements which are disposed in an array form. Furthermore, one semiconductor chip may include a drive circuit which drives one light emitting element or plural light emitting elements. In addition, the substrate may be configured by, for example, silicon, SiC, a compound semiconductor, sapphire, or the like. However, the substrate is not limited to this, and a substrate (hereinafter, may be collectively referred to as a semiconductor substrate) including at least a semiconductor may be a substrate which is formed by other materials. For example, a light receiving element such as a contact image sensor is formed in a silicon substrate, and a light emitting element, such as a surface light emitting type semiconductor laser or a light emitting diode may be formed in a semiconductor substrate that is configured by a group III-V compound such as GaAs.

In the following description, a method of extracting each semiconductor chip from a semiconductor substrate on which plural light receiving elements are formed will be described with reference to the accompanying drawings. It should be noted that a scale or a shape of the drawing is exaggerated to facilitate understanding of characteristics of the invention, and is not necessarily the same as a scale or a shape of an actual device.

Exemplary Embodiments

FIG. 1 is a flowchart illustrating an example of a manufacturing process of a semiconductor chip according to an exemplary embodiment of the present invention. As illustrated in FIG. 1, a method for manufacturing a semiconductor chip according to the present exemplary embodiment includes step (S100) of forming a light receiving element, step (S102) of forming a resist pattern, step (S104) of forming a microgroove and a groove for alignment on a front surface of a semiconductor substrate, step (S106) of removing the resist pattern, step (S108) of affixing a tape for dicing on the front surface of the semiconductor substrate, step (S110) of exposing the groove for alignment by grinding a back surface of the substrate through machining or the like, step (S112) of positioning a dicing blade using the exposed groove for alignment as a mark, step (S114) of dicing the back surface of the semiconductor substrate using the dicing blade, step (S116) of thinning the semiconductor substrate by grinding the back surface of the substrate through machining or the like, step (S118) of irradiating the tape for dicing with ultraviolet light (UV) and affixing a tape for expanding on the back surface of the semiconductor substrate, step (S120) of removing the tape for dicing and irradiating the tape for expanding with ultraviolet light, and step (S122) of picking a semiconductor chip and die mounting on a circuit board or the like. The sectional views of the semiconductor substrate illustrated in FIGS. 2A to 2C, FIGS. 3A to 3D, and FIGS. 4A to 4E correspond to each of step S100 to step S122.

As illustrated in FIG. 2A, in step (S100) of forming a light receiving element, plural light receiving elements 100 are formed in an element formation area of a front surface of a semiconductor substrate W. Here, for example, the semiconductor substrate W is configured by a silicon substrate. The light receiving element 100 includes, for example, a photo diode, a photo transistor, or the like. The light receiving element 100 configures, for example, an image sensor or the like of a contact type. It should be noted that, in the drawings, one area is illustrated for the light receiving elements 100, but one light receiving element 100 exemplifies an element included in one semiconductor chip which is diced, and not only one light receiving element, but also plural light receiving elements or other circuit elements may be formed in the area for the one light receiving element 100. In addition, a groove for alignment which is used as an alignment mark at the time when dicing is applied to the substrate is formed in the alignment area of the semiconductor substrate W, as will be described later.

Figure 5:
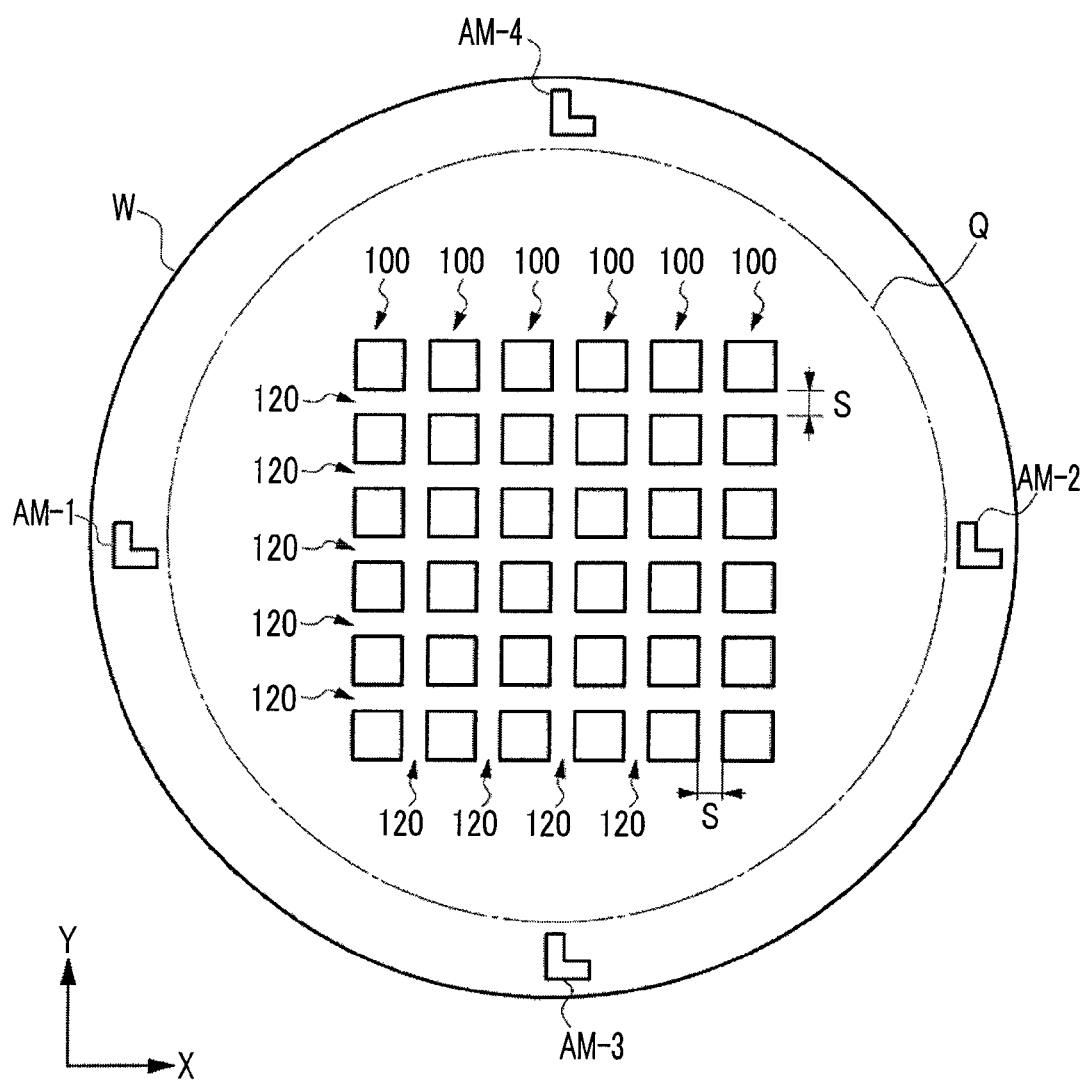
FIG. 5 is a schematic plan view of a semiconductor substrate (wafer) at the time when a circuit formation is completed.

FIG. 5 is a plan view illustrating an example of the semiconductor substrate W at the time when a step of forming a light receiving element is completed. For the sake of convenience, only the light receiving elements 100 are illustrated in the central portion in FIG. 5. On a front surface of the semiconductor substrate W, plural light receiving elements 100 are formed in an array form in a matrix direction. A planar area of the light receiving element 100 is an approximately rectangular shape, and the light receiving elements 100 are separated from each other by cutting areas 120 which are defined by scribe lines or the like having a constant interval S. In addition, the outside of the element formation area in which the light receiving elements are formed may be used as the alignment area. For the sake of convenience, a line alternating long and short dashes which forms a circle represents a boundary between the element formation area and the alignment area.

If the formation of the light receiving element is completed, a resist pattern is then formed on the front surface of the semiconductor substrate W (S102). As illustrated in FIG. 2B, a resist pattern 130 is worked in such a manner that the cutting areas 120 which are defined by the scribe line or the like of the front surface of the semiconductor substrate W are exposed. The work for forming the resist pattern 130 is performed by a photolithography process.

Subsequently, the microgroove and the groove for alignment are formed on the front surface of the semiconductor substrate W (S104). As illustrated in FIG. 2C, the microgroove (hereinafter, for the sake of convenience, referred to as microgroove or groove on the front surface side) 140 has a constant depth and is formed in the element formation area of the semiconductor substrate W, using the resist pattern 130 as a mask, and a groove AM for alignment with a depth greater than that of the microgroove is formed in the alignment area. The microgroove 140 is formed in a lattice shape along the cutting area 120. The groove AM for alignment is a concave portion with a depth greater than that of the microgroove 140, and is formed at a position which is determined in advance with respect to an arbitrary reference point on the substrate.

A width Sa of the front surface side of the microgroove 140 is approximately the same as that of an opening which is formed in the resist pattern 130, and the width Sa of the microgroove 140 is, for example, from several μm to tens of μm. In addition, a depth Da thereof is, for example, approximately a dozen μm to approximately 100 μm, and is formed to at least be deeper than that of a functional element such as a light receiving element. Meanwhile, the width Sb of the front surface side of the groove AM for alignment is approximately the same as that of an opening which is formed in the resist pattern 130, and for example, a width Sb is greater than the width Sa of the microgroove 140, and is tens of μm. In addition, a depth Db from the front surface of the substrate of the groove AM for alignment is formed so as to be deeper than the depth Da of the microgroove 140 from the front surface of the substrate. As illustrated in FIG. 5, for example, plural grooves AM for alignment may be formed in an outer circumference area of the outside of the element formation area, that is, in the alignment area. In general, grooves for alignment AM-1, AM-2, AM-3, and AM-4 are respectively formed by two chips in an X direction and a Y direction through a reference point which is the center of the semiconductor substrate W. A method of forming the microgroove 140 and the groove AM for alignment will be described in detail later.

In a case in which the microgroove 140 is formed by a general dicing blade, the interval S of the cutting areas 120 increases to approximately 40 μm to 60 μm which is a sum of a groove width, and a margin width of the dicing blade based on a chipping amount. Meanwhile, in a case in which the microgroove 140 is formed in a semiconductor process, not only is the width of the groove narrow, but also the margin width for cutting may become narrower than the margin width in a case in which the dicing blade is used. In other words, the interval S between the cutting areas 120 may become narrow, and for this reason, the acquired number of the semiconductor chips may be increased by disposing the light receiving element on a wafer at a high density. A "front surface side" of the present exemplary embodiment indicates a surface side on which a functional element of a light receiving element or the like is formed, and a "back surface side" indicates a surface side opposite to the "front surface side".

Subsequently, the resist pattern is removed (S106). As illustrated in FIG. 3A, if the resist pattern 130 is removed from a front surface of the semiconductor substrate, the microgroove 140 formed along the cutting areas 120 is exposed on the front surface, and the groove AM for alignment is exposed in the alignment area.

Subsequently, a tape for dicing of an UV-curable type is affixed (S108). As illustrated in FIG. 3B, a tape 150 for dicing with an adhesive layer is affixed on the front surface of the substrate on the light receiving element side.

Subsequently, the groove AM for alignment is exposed on the back surface side of the substrate by grinding the back surface of the substrate (S110). As illustrated in FIG. 3C, the substrate is thinned to a grinded position C which is a thickness Dc of the substrate, and reaches the groove AM for alignment, but does not reach the microgroove 140. That is, a relationship of Da<Dc<Db is satisfied. The substrate is thinned by, for example, back grinding (machining), and the substrate may be formed at a constant thickness by moving a magnet 160 which rotates in a horizontal direction or a vertical direction. The substrate may be thinned by chemical mechanical polishing (CMP). As illustrated in FIG. 3D, if the semiconductor substrate W is thinned to the grinded position C, the groove AM for alignment is exposed on the back surface side of the substrate.

Subsequently, a cutting member is positioned to the microgroove 140 by using the exposed groove for alignment as an alignment mark (S112). In this example, a dicing blade is used as the cutting member. A dicing blade or a dicing blade device which is disposed on the back surface side of the substrate is positioned by using the groove AM for alignment that is exposed on the back surface side of the substrate as an alignment mark. A sensing unit that senses the groove for alignment which is exposed on the back surface side of the substrate is used for the positioning, and the dicing blade is positioned with respect to the corresponding microgroove, using the sensing result of the sensing unit. The sensing unit is, for example, an imaging camera that images the back surface side of the substrate, the pattern and position of the groove AM for alignment are recognized based on the image of the back surface of the substrate which is captured by the imaging camera, and the dicing blade is positioned to the corresponding microgroove based on the recognized result. As illustrated in FIG. 5, for example, in a case in which the grooves AM for alignment are respectively formed by two chips in the X direction and the Y direction of the semiconductor substrate W, four grooves AM-1 to AM-4 for alignment are recognized from the captured image. Subsequently, positioning in the X direction is performed by using the grooves AM-1 and AM-2 for alignment, and positioning in the Y direction is performed by using the grooves AM-3 and AM-4 for alignment. By doing so, the dicing blade is positioned with respect to the microgrooves to be cut. If the positioning in a two-dimensional direction of the dicing blade is completed, positioning in a Z direction of the dicing blade is then performed. The Z direction is a thickness direction of the semiconductor substrate W, and by the positioning of the Z direction, a depth of a groove 170 which is formed on the back surface side is determined.

If the positioning is completed, half dicing is performed by the dicing blade along the microgroove 140 from the back surface side of the substrate (S112). The positioned dicing blade horizontally moves in the X direction or the Y direction while rotating. As a result, as illustrated in FIG. 4A, the groove 170 on the back surface side is formed toward the microgroove 140.

Figures 6A, 6B:
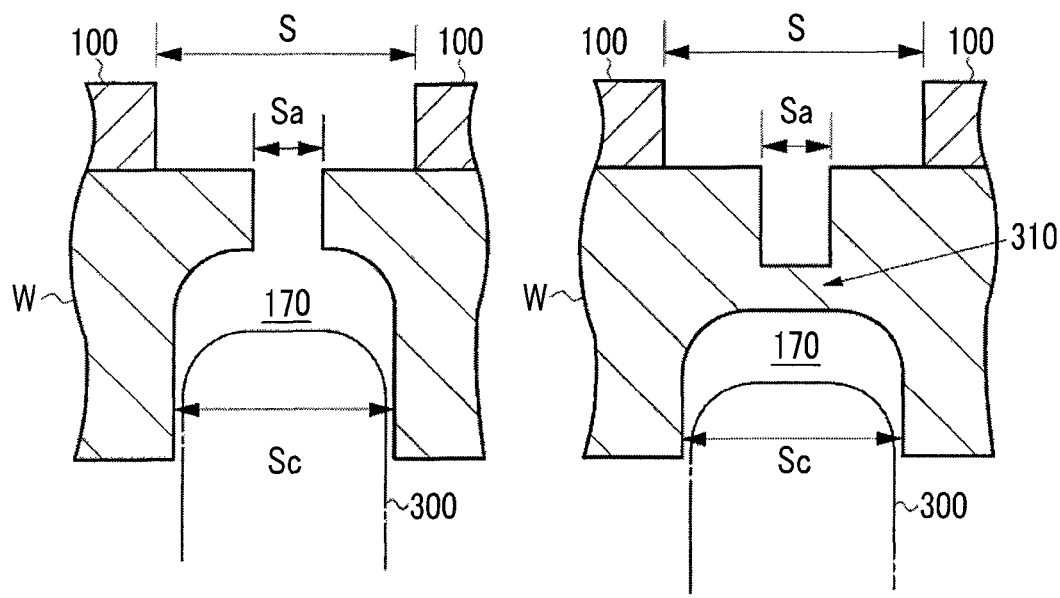
FIGS. 6A and 6B are sectional views illustrating half-dicing performed by a dicing blade.

FIGS. 6A and 6B are schematic sectional views illustrating a groove on the back surface side which is formed by the dicing blade. A dicing blade 300 cuts the semiconductor substrate W along the microgroove 140 from the back surface, while rotating, and thereby forming the groove 170 in the semiconductor substrate W. For example, the dicing blade 300 is a cutting member of a disk shape. Herein, an example in which a tip portion has a constant thickness is illustrated, but a dicing blade having a tapered tip portion may be adopted. The dicing blade 300 is aligned in a plane parallel to the back surface of the substrate in the outside of the semiconductor substrate W by using the groove AM for alignment exposed in the back surface of the substrate as a mark, and furthermore, is aligned in the thickness direction of the substrate by moving in a direction perpendicular to the back surface of the semiconductor substrate W by a predetermined amount. After being aligned, the groove 170 is formed in the semiconductor substrate W by moving at least one of the dicing blade 300 or the semiconductor substrates W in the X direction or the Y direction parallel to the back surface of the semiconductor substrate W, while the dicing blade 300 rotates.

The groove 170 (kerf width Sc) that is formed by the dicing blade 300 has approximately the same width as the thickness of the dicing blade 300. In addition, the groove 170 on the back surface side which is formed by the dicing blade 300 may have a depth that reaches the microgroove 140, as illustrated in FIG. 6A, and may have a depth that does not reach the microgroove 140, as illustrated in FIG. 6B. That is, in a case of the latter, if a distance of a portion 310 existing between the microgroove 140 and the groove 170 on the back surface side is equal to or less than a predetermined value, an area between the groove 170 and the microgroove 140 is easily divided. Here, the microgroove 140 is formed at the width Sa narrower than the width Sc of the groove 170 on the back surface side formed by the dicing blade, but this is due to the fact that, if the microgroove 140 is formed at a width narrower than that of the groove 170 on the back surface side, the number of semiconductor chips which may be acquired from one wafer increases, compared to a case in which the semiconductor substrate is divided only by the dicing blade. As illustrated in FIG. 2C, if the microgroove 140 with a length of several μm to approximately a dozen μm may be formed from the front surface of the semiconductor substrate to the back surface thereof, it is not necessary to form the groove on the back surface side using the dicing blade in the first place, but it is not easy to form a microgroove having such a depth. For this reason, half dicings from the back surface performed by the dicing blade are combined.

When the half dicing is performed by the dicing blade 300, the cut semiconductor chip is retained by the tape 150 for dicing. The tape 150 for dicing includes a tape base member and an adhesive layer that is stacked on the tape base member. The adhesive layer is configured by an ultraviolet-curable resin, and has a constant viscosity before ultraviolet light is applied thereto. If ultraviolet light is applied thereto, the adhesive layer is cured and thereby adhesive properties thereof are lost. For this reason, the adhesive layer adheres to the front surface of the substrate including the microgroove 140 and the groove AM for alignment, and retains the semiconductor chip, in such a manner that the semiconductor chip is not detached after dicing.

Figure 4B:
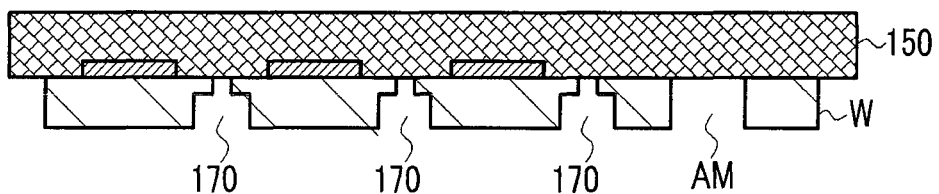

Subsequently, the back surface of the substrate is ground and the thickness of the substrate is further thinned (S116). The thinning of the substrate is performed by back grinding (machining), in the same manner as in a case of the previous step S110. As illustrated in FIG. 4B, by performing the back grinding of the back surface side of the substrate, the substrate is further thinned, and thereby the substrate has a desired thickness. However, the thinning step is not essential, and may be omitted, if the substrate reaches a desired thickness in the previous step S110, for example.

Figure 4C:
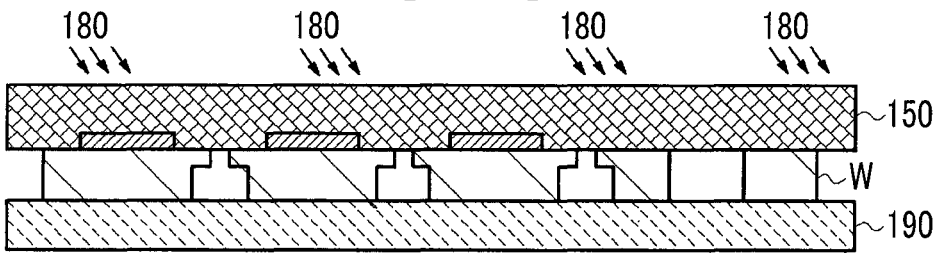

Subsequently, the tape for dicing is irradiated with ultraviolet light (UV), and a tape for expanding of a ultraviolet-curable type is affixed to the back surface of the substrate (S118). As illustrated in FIG. 4C, the tape 150 for dicing is irradiated with ultraviolet light 180, and adhesive layer thereof is cured. Thereafter, a tape 190 for expanding is affixed to the back surface of the semiconductor substrate W.

Figure 4D:
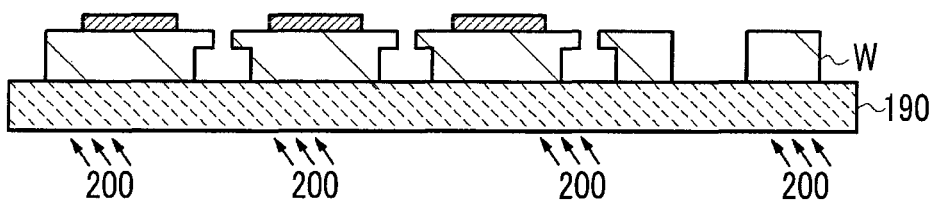

Subsequently, the tape for dicing is removed, and the tape for expanding is irradiated with ultraviolet light (S120). As illustrated in FIG. 4D, the tape 150 for dicing is removed from the front surface of the semiconductor substrate. In addition, the tape 190 for expanding of the back surface of the substrate is irradiated with ultraviolet light 200, and adhesive layer thereof is cured. The tape 190 for expanding has elasticity in a base member and stretches in such a manner that picking up of the semiconductor chip which is diced after the dicing is easily performed, and the interval between the light receiving elements is expanded.

Figure 4E:
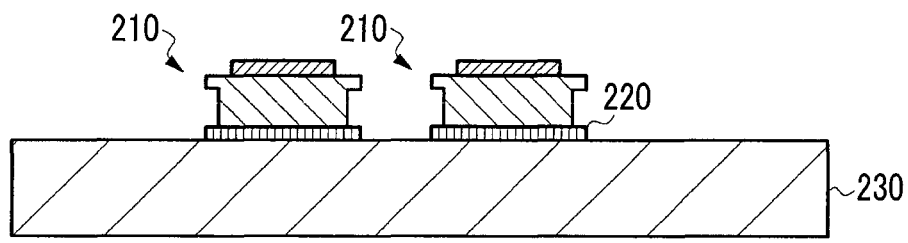

Subsequently, picking up and die mounting of the diced semiconductor chip are performed (S122). As illustrated in FIG. 4E, a semiconductor chip 210 which is picked up from the tape 190 for expanding is mounted on a circuit board 230 through a fixing member 220 such as a conductive paste, such as adhesive or solder, and the circuit board 230 is mounted in an electronic device such as an image forming device.

Figures 7A, 7B, 7C:
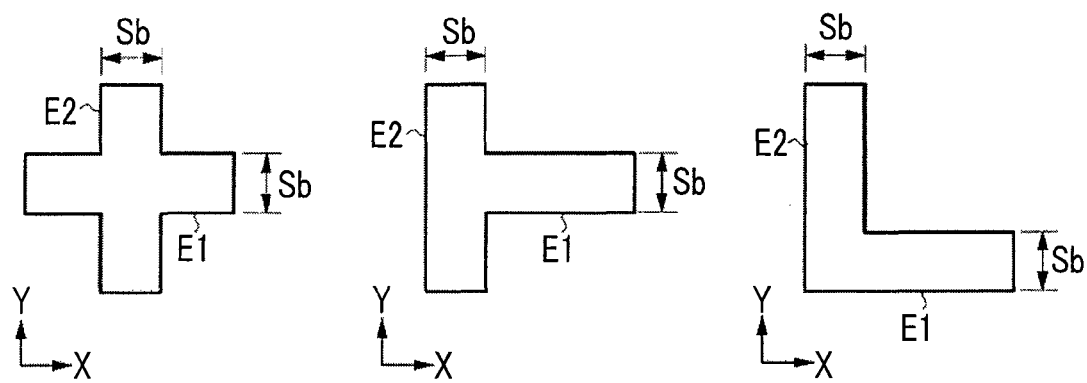
FIGS. 7A to 7C are views illustrating examples of a planar shape of a groove for alignment according to the exemplary embodiment of the present invention.

Subsequently, a method of forming the microgroove and the groove for alignment which are described in step S104 (FIG. 2C) will be described. As described above, the groove AM for alignment is used as an alignment mark, when cutting by a cutting member is performed from the back surface of the semiconductor substrate. For this reason, if the groove AM for alignment may be used as an alignment mark, a planar shape of the groove AM for alignment is not limited to a particular shape. FIGS. 7A to 7C are examples of a planar shape of the groove for alignment. FIG. 7A illustrates a cross shape, FIG. 7B illustrates a T shape, and FIG. 7C illustrates an L shape. As a common point of those, each groove for alignment has portions E1 and E2 that extend in the X direction and the Y direction, and the widths Sb of the two extending portions E1 and E2 are equal to each other.

In the present exemplary embodiment, for example, the microgroove 140 and the groove AM for alignment are simultaneously formed in the same step. As illustrated in FIG. 2C, an opening for etching the microgroove 140 is formed in the resist pattern 130, and a width of the opening is approximately the same as the width Sa on the front surface side of the microgroove 140. Furthermore, an opening for etching the groove AM for alignment is formed in the resist pattern 130, and a width of the opening is approximately the same as the width Sb of the portion E1 (E2) which extends in the X direction or the Y direction of the groove AM for alignment. In order to make the depths of the microgroove 140 and the groove AM for alignment different from each other (Da<Db) which are simultaneously formed in the same step, a difference between etching speeds depending on the width of the opening of the resist pattern is used, in the present exemplary embodiment. That is, when the width of the opening for forming the groove AM for alignment is greater than the width of the opening of the resist pattern 130 for forming the width Sa of the microgroove 140, the etching speed of the groove AM for alignment is faster than etching speed of the microgroove 140, and as a result, the etched depth Db of the groove AM for alignment is deeper than the etched depth Da of the microgroove 140. A difference (Db−Da) between the etched depths may have a magnitude by which a grinding position C at the time of grinding the back surface may be set.

Figure 8:
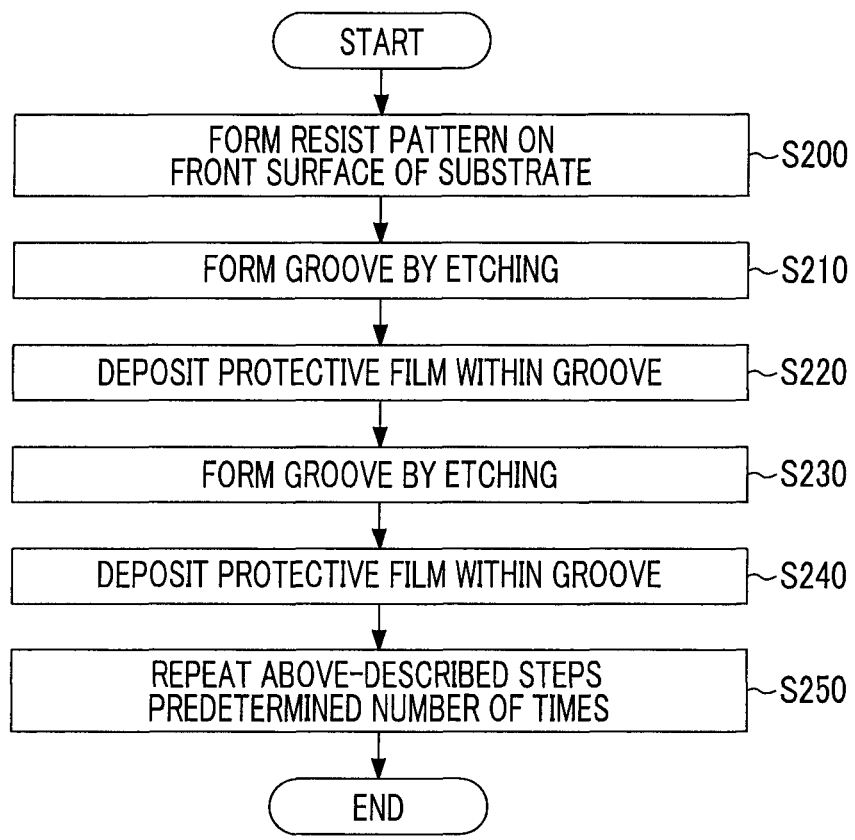
FIG. 8 is a flowchart illustrating an example of a forming method of a microgroove and a groove for alignment according to an exemplary embodiment of the present invention.

FIG. 8 is an example of a forming method when the microgroove and the groove for alignment are simultaneously formed in the same step. In the present forming method, it is possible to form a groove with a deeper depth, that is, a groove with a great aspect ratio through anisotropic dry etching, by repeating the etching step and a protective film deposition step more than once, using a reactive ion etching (RIE) device. Switching of the etching step and the protective film deposition step is made by exchanging reactive gas which is supplied to the RIE device.

Figure 9A:
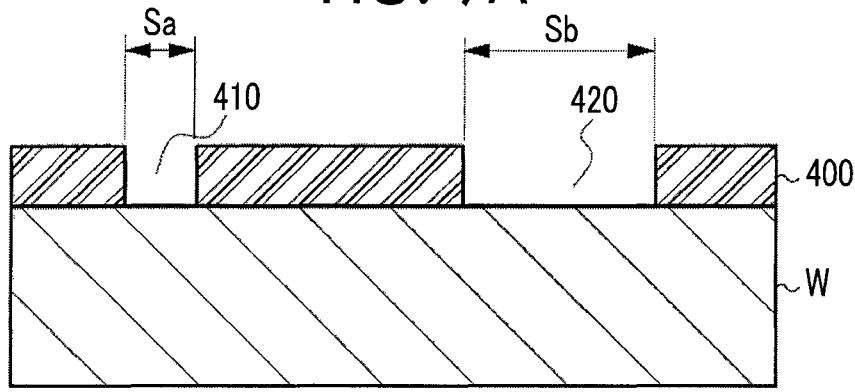
FIGS. 9A to 9D are schematic sectional views of a semiconductor substrate corresponding to the forming method of FIG. 8.

Schematic sectional views of a groove which is formed in each step of FIG. 8 are illustrated in FIGS. 9A to 9D, and a forming method will be described with reference to FIGS. 9A to 9D. A shape or the like of the groove illustrated in FIGS. 9A to 9D is schematically illustrated for easy understanding. After a light receiving element is formed in a silicon substrate W, a front surface of the silicon substrate is coated with a photoresist, and thereafter, a resist pattern is formed on the front surface of the substrate through a photolithography step (S200). As illustrated in FIG. 9A, a resist pattern 400 is formed on the front surface of the silicon substrate W. The photoresist is, for example, an i line resist with a viscosity of 100 cpi, and has coating with a thickness of approximately 8 μm. An opening 410 for forming the microgroove 140 and an opening 420 for forming the groove AM for alignment are formed in the photoresist, by using, for example, an i line stepper and developing solution with TMAH 2.38%. A width of the opening 410 is approximately the same as the width Sa of the microgroove 140, and is, for example, 5 μm. A width of the opening 420 is approximately the same as the width Sb of the groove AM for alignment, and is, for example, a dozen μm.

Figure 9B:
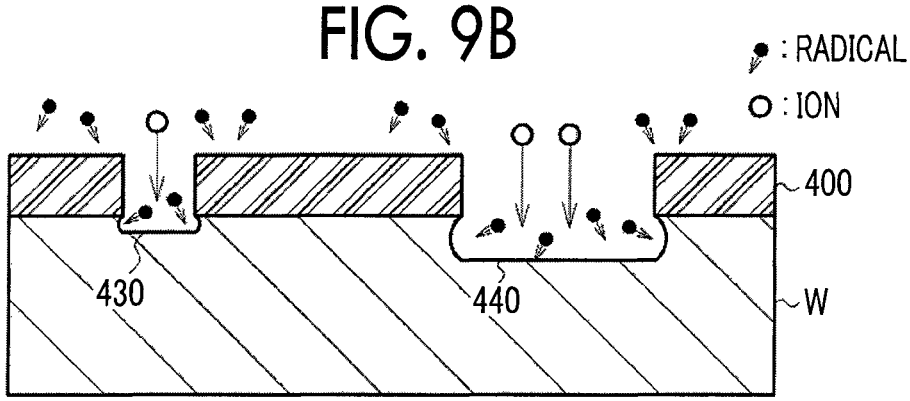

Subsequently, a groove is formed by etching (S210). In the present forming method, for example, inductively coupled plasma (ICP) is used as reactive ion etching (RIE) device. Etching conditions are, for example, as follows. Power is 600 W, bias power is 23 W, reactive gas: $SF_6$=170 sccm, and etching time is seven seconds. As illustrated in FIG. 9B, by the etching, a groove 430 is formed on the silicon surface which is exposed by the opening 410, and a groove 440 is formed on the silicon surface which is exposed by the opening 420. The etching is performed by a constant selection ratio at an etching speed in the horizontal direction and vertical direction of the substrate by radical and ions which are generated by plasma of the reactive gas. In addition, since the width of the opening 420 is greater than that of the opening 410, the opening 420 is easily etched, and as a result, a depth of the etching of the groove 440 is deeper than that of the groove 430.

Figure 9C:
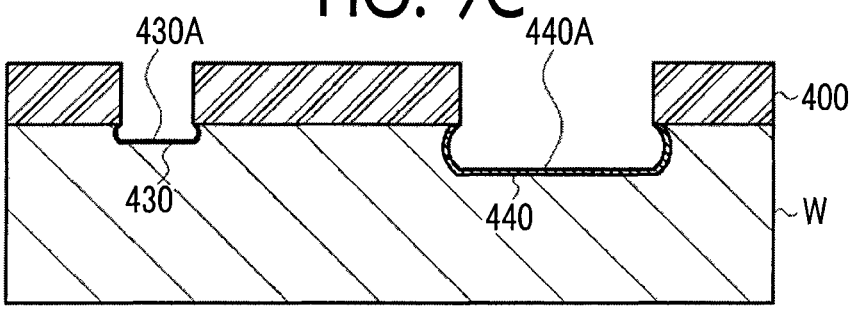

Subsequently, a protective film is deposited within the groove (S220). Depositing conditions of the protective film is, for example, as follows. Power and bias power are the same as those at the time of etching, but reactive gas is switched from $SF_6$ to $C_4F_8$. $C_4F_8$ of, for example, 120 sccm is supplied, and depositing time of the protective film is five seconds. As illustrated in FIG. 9C, by the depositing of the protective film, protective films 430A and 440A are formed within the groove 430 and the groove 440.

Figure 9D:
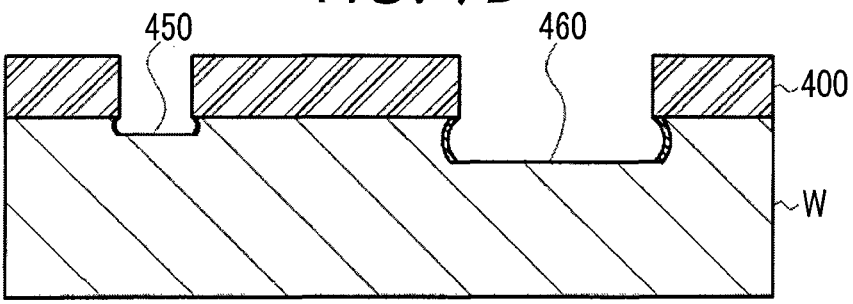
Figure 10A:
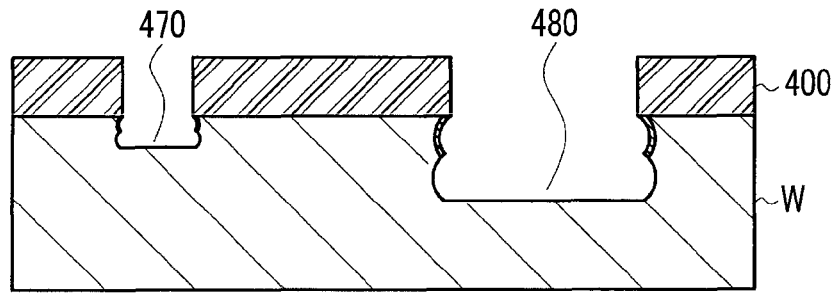
FIGS. 10A and 10B are schematic sectional views of a semiconductor substrate corresponding to the forming method of FIG. 8.

Subsequently, a groove is formed by etching (S230). Etching conditions are the same as those at the time of step S210. Reactive gas is switched from $S_4F_8$ to $SF_6$, and a side wall of the groove is attacked by only a radical among the radical and ions which are generated by the plasma of the reactive gas, but the groove is not etched because the protective films 430A and 440A are there. Meanwhile, as illustrated in FIG. 9D, in the bottom of the groove, the protective films 430A and 440A are removed by the ions that are vertically incident by the bias power, and silicon is exposed at bottoms 450 and 460 of the grooves. For this reason, the silicon that is exposed at the bottoms 450 and 460 of the grooves is etched, and as illustrated in FIG. 10A, a different groove 470 is formed at the bottom 450 of the groove 430 that is formed at first, and in the same manner, a different groove 480 is formed at the bottom 460 of the groove 440 that is formed at first.

Figure 10B:
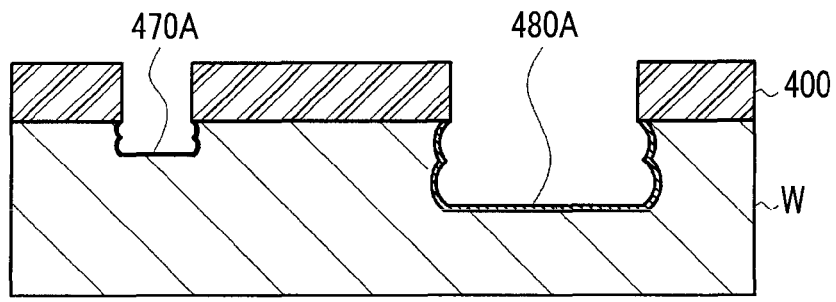

Subsequently, a protective film is deposited within the groove (S240). This step is the same as that at the time of step S220. Reactive gas is switched from $SF_6$ to $C_4F_8$. As illustrated in FIG. 10B, protective films 470A and 480A are deposited within the grooves. By repeating the etching and the depositing of the protective films several times, anisotropic dry etching is performed, and it is possible to simultaneously form the deep microgroove 140 and the deep groove AM for alignment. Hence, since the depth of the groove that is formed by the opening 410 is shallower than that of the groove that is formed by the opening 420, the etched depth Db of the groove for alignment is deeper than the etched depth Da of the microgroove.

Figure 11:
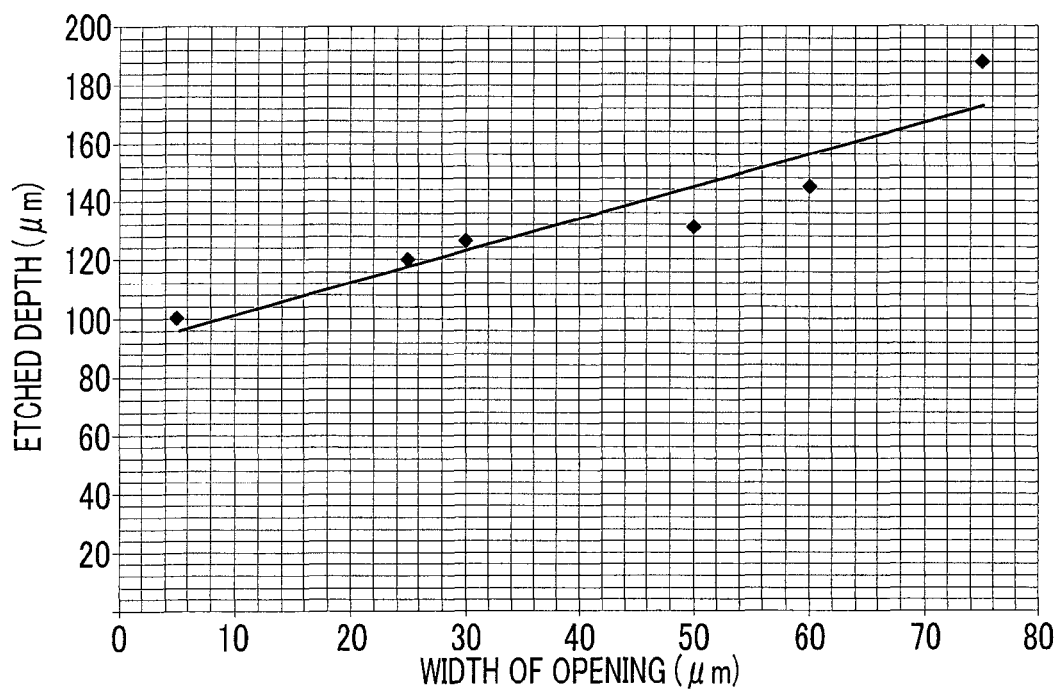
FIG. 11 is a graph illustrating a relationship between a width of an opening and an etched depth.

FIG. 11 is a graph illustrating a relationship between the width of the opening at the time of forming the groove for alignment of an L shape illustrated in FIG. 7C and the etched depth, in a silicon substrate. For example, when the width Sa of the microgroove 140 is approximately 5 μm, if the width Sb of the groove for alignment is 70 μm, and when the etched depth Da of the microgroove 140 is approximately 100 μm, the etched depth Db of the groove AM for alignment may be made to be approximately 170 μm. Approximately 70 μm is obtained as a difference (Db−Da) of etched depth, and thereby it is possible to set the grinding position C illustrated in FIG. 3C within that range.

The aforementioned etching conditions and protective film deposition conditions are just an example, and it is possible to appropriately change the conditions depending on the shape, the size, and the etched depth of the microgroove 140 and the groove AM for alignment. For example, by increasing the number of repetitions of the etching step and the protective film deposition step, it is possible to form the microgroove and the groove for alignment with a higher aspect ratio. In addition, the side walls of the microgroove 140 and the groove AM for alignment may be formed so as to approximately vertically extend from the front surface of the substrate, or may be formed in such a manner that the side walls tilt in a forward direction so that the width of the groove is gradually narrowed. The tile of the side wall is obtained by appropriately changing the etching conditions and the protective film deposition conditions.

As described above, according to the present exemplary embodiments, the microgroove and the groove for alignment are formed on the front surface side of the substrate, and the groove for alignment is exposed on the back surface side of the substrate by thinning the back surface of the substrate, and thereby it is possible to use the groove for alignment as an alignment mark (positioning mark) of the cutting member on the back surface side of the substrate, and to position the dicing blade as a cutting member on the microgroove corresponding to the front surface side. In addition, according to the present exemplary embodiments, since it is unnecessary to dispose a sensing camera or the like for sensing the position of the microgroove on the front surface side of the substrate, the degree of freedom to use a space of the front surface side of the substrate is increased. Furthermore, an infrared camera or the line for sensing the position of the microgroove from the back surface side of the substrate is not required.

In the aforementioned exemplary embodiments, an example in which the substrate is cut by the dicing blade from the back surface side of the substrate is described, but when cutting the substrate, cutting members other than the dicing blade may be used. For example, the cutting member may be a laser unit that cut the substrate using laser irradiation, and even in this case, the irradiation position of the laser is positioned at the corresponding microgroove by using the groove for alignment as a mark. As a cutting method which uses laser irradiation, the substrate may be melted and cut by heat produced by the laser irradiation, and the substrate may be divided by modifying the interior of the substrate. The laser unit may include a laser element that emits a laser and a controller that controls the laser emission of the laser element.

Furthermore, according to the aforementioned exemplary embodiments, an example in which the microgroove and the groove for alignment are formed in the same step is described, but the microgroove and the groove for alignment may be formed in manufacturing steps different from each other. For example, the etching step of the microgroove is performed separately from the etching step of the groove for alignment. In a case of being manufactured in a separate step, it is not necessary for the width Sb of the groove for alignment to be greater than the width Sa of the microgroove, and may be smaller than the width Sa of the microgroove. However, it is necessary for the depth Db of the groove for alignment to be deeper than the depth Da of the microgroove.

Furthermore, according to the aforementioned exemplary embodiments, an example in which the microgroove and the groove for alignment are formed in semiconductor substrate configured by silicon is described, but the semiconductor substrate may be a semiconductor substrate or an insulating substrate which is configured by other materials, for example, GaAs, sapphire, SiC or the like. In addition, an example in which silicon is used as a material that produces a difference of an etching speed or an etched depth caused by a difference of the width of the opening at the time of anisotropic dry etching is described, but other materials other than silicon may be used.

Furthermore, in the aforementioned exemplary embodiments, a planar shape of the groove for alignment is illustrated as in FIGS. 7A to 7C, but these are an example, and the planar shape of the groove for alignment may be any shape, for example, a polygonal shape or a circular shape, as long as it may be used as a mark for the alignment. Furthermore, in the aforementioned exemplary embodiments, an example in which the groove for alignment is formed in an alignment area of the outer edge of the substrate is described, but the groove for alignment may be not necessarily formed in the outer edge of the substrate, and may be formed in the central portion of the substrate or within an element formation area, as long as it may be used as a mark for positioning. Furthermore, in the aforementioned description, the marks for alignment are respectively formed by two chips in the X direction and the Y direction, but the number of the marks for alignment is arbitrary, and may be four or more, or may be smaller than four.

As described above, preferable exemplary embodiments of the present invention are described in detail, but the present invention is not limited to a specific exemplary embodiment, and various modification and changes may be made within a range without departing from the gist of the present invention described in the claims.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for manufacturing a semiconductor chip comprising:
   forming a groove on a front surface side of a substrate at a position to be cut, and forming a concave portion of the front surface side deeper than the groove as a positioning mark for positioning a cutting member that performs cutting from a back surface of the substrate toward the front surface side at the position to be cut;
   thinning the substrate from the back surface of the substrate so as to reach the concave portion and not reach the groove on the front surface side;
   positioning the cutting member on the back surface of the substrate by using the concave portion exposed on the back surface of the substrate as the positioning mark; and
   performing cutting from the back surface side of the substrate toward the groove on the front surface side of the substrate by using the positioned cutting member,
   wherein the cutting comprises forming a groove in the back surface of the substrate.

2. The method for manufacturing a semiconductor chip according to claim 1, wherein
   the groove on the front surface side and the concave portion are formed by a same etching process in a same step.

3. The method for manufacturing a semiconductor chip according to claim 2, wherein
   the groove on the front surface side and the concave portion are formed by using a difference of etching speed in the same etching process.

4. The method for manufacturing a semiconductor chip according to claim 2, wherein
   a width of an opening for forming the concave portion is greater than a width of an opening for forming the groove on the front surface side, in a width of an opening of a protective film for the etching.

5. The method for manufacturing a semiconductor chip according to claim 2, wherein
   the groove on the front surface side and the concave portion are formed by anisotropic etching.

6. The method for manufacturing a semiconductor chip according to claim 2, wherein
   the groove on the front surface side and the concave portion are formed by anisotropic dry etching.

7. The method for manufacturing a semiconductor chip according to claim 2, wherein
   the cutting member includes a dicing blade, and forms a groove on a back surface side wider than the groove on the front surface side toward the groove on the front surface side, by using the dicing blade.

8. The method for manufacturing a semiconductor chip according to claim 2, wherein
   the cutting member includes a laser unit, and forms a groove on a back surface side wider than the groove on the front surface side toward the groove on the front surface side, by using a laser emitted from the laser unit.

9. The method for manufacturing a semiconductor chip according to claim 1, wherein
   the groove on the front surface side and the concave portion are formed by anisotropic etching.

10. The method for manufacturing a semiconductor chip according to claim 1, wherein
    the groove on the front surface side and the concave portion are formed by anisotropic dry etching.

11. The method for manufacturing a semiconductor chip according to claim 1, wherein
    the cutting member includes a dicing blade, and forms a groove on a back surface side wider than the groove on the front surface side toward the groove on the front surface side, by using the dicing blade.

12. The method for manufacturing a semiconductor chip according to claim 1, wherein
    the cutting member includes a laser unit, and forms a groove on a back surface side wider than the groove on the front surface side toward the groove on the front surface side, by using a laser emitted from the laser unit.

13. The method for manufacturing a semiconductor chip according to claim 1, wherein
    a plurality of the concave portions are formed in an outer edge area of the front surface of the substrate, and
    the cutting member is positioned by using a concave portion which is selected from among the plurality of concave portions.

14. The method for manufacturing a semiconductor chip according to claim 1, wherein
    a shape of the concave portion is at least one of a cross shape, a T shape, and an L shape.

15. A method for positioning a cutting member comprising:
    thinning a back surface of a substrate so as to reach a concave portion formed on the front side surface of the substrate and not to reach a groove formed on the front surface side, the groove formed on the front surface side at a position to be cu, and the concave portion being deeper than the groove on the front surface side;
    positioning a cutting member along the back side surface by using the concave portion exposed on the back surface of the substrate as a positioning mark, the cutting member is configured to cut a groove on a back surface side toward the front surface side of the substrate; and
    forming a groove in the back surface of the substrate in a cutting process.

16. The method for manufacturing a semiconductor chip according to claim 1, wherein the cutting is performed on only a portion of the back surface not including the concave portion.

17. A method for manufacturing a semiconductor chip comprising:
    forming a first groove on a front surface side of a substrate at a position to be cut, and forming a concave portion of the front surface side deeper than the groove;
    thinning the substrate from a back surface side of the substrate so as to reach the concave portion and not reach the groove on the front surface side;

detecting a position of the concave portion from the back surface side after thinning the substrate;

positioning the cutting member on the back surface of the substrate based on the detection of the position of the concave portion; and cutting the substrate from the back surface side of the substrate toward the front surface side of the substrate by forming a second groove in the back surface side of the substrate.

18. The method for manufacturing a semiconductor chip, according to claim 17, wherein the cutting comprises forming the second groove which is connected with the first groove.

19. The method for manufacturing a semiconductor ship, according to claim 17, wherein the cutting member is a dicing table.

* * * * *